United States Patent [19]

Sakai et al.

[11] Patent Number: 5,751,577
[45] Date of Patent: May 12, 1998

[54] PRODUCTION DATA PREPARING SYSTEM FOR PRODUCING A METAL MASK PLATE

[75] Inventors: Akira Sakai; Miki Ichikawa; Seiichi Urita, all of Kawasaki, Japan

[73] Assignee: Fujitsu Limited, Kawasaki, Japan

[21] Appl. No.: 761,863

[22] Filed: Dec. 9, 1996

Related U.S. Application Data

[63] Continuation of Ser. No. 288,049, Aug. 10, 1994, abandoned.

[30] Foreign Application Priority Data

Sep. 27, 1993 [JP] Japan ................................. 5-239514

[51] Int. Cl.⁶ .................... G05B 19/42; G06F 19/00; G06G 7/64; G06G 7/66
[52] U.S. Cl. ............... 364/191; 364/474.02; 364/474.24; 364/474.25
[58] Field of Search .............................. 364/468.01, 190, 364/191, 488, 489, 490, 491

[56] References Cited

U.S. PATENT DOCUMENTS

| | | | |
|---|---|---|---|
| 4,577,276 | 3/1986 | Dunlop et al. | 364/491 |
| 4,600,995 | 7/1986 | Kinoshita | 364/491 |
| 5,161,114 | 11/1992 | Akiyama | 364/490 |
| 5,187,668 | 2/1993 | Okude | 364/468 |
| 5,292,687 | 3/1994 | Isozaki | 437/209 |
| 5,329,158 | 7/1994 | Lin | 257/666 |
| 5,349,500 | 9/1994 | Casson et al. | 361/749 |
| 5,404,313 | 4/1995 | Shiohara | 364/488 X |
| 5,416,720 | 5/1995 | Fukui | 364/488 X |
| 5,465,217 | 11/1995 | Yip et al. | 364/491 |

*Primary Examiner*—Paul P. Gordon
*Assistant Examiner*—Sheela S. Rao
*Attorney, Agent, or Firm*—Staas & Halsey

[57] ABSTRACT

A production data preparing system, for providing a metal mask plate used for soldering various SMDs on a printed-board, includes: a CAD file for storing production data for preparing the printed-circuit board; a foot-print shape storage unit for storing target foot-print shape data extracted from the CAD file in order to change the foot-print shapes; a mounting parts data storage unit for storing data of target SMDs extracted from the CAD file; a management table file for storing packaging parts attributes and foot-print shape changing rules and the relationships therebetween; and a preparation unit for preparing production data used for providing the metal mask plate.

22 Claims, 20 Drawing Sheets

| NAME | | SHAPE | FEATURE | |
|---|---|---|---|---|
| | | | MATERIAL | PINS, LEADS |
| SOP | SMALL OUTLINE PACKAGE | | PLASTICS | TWO SIDES |
| FPP (QFP) | FLAT PLASTIC PACKAGE | | PLASTICS | FOUR SIDES |
| LCC | LEADLESS CHIP CARRIER | | CERAMICS | FOUR SIDES CONTACTS |
| PLCC | PLASTIC LEADED CHIP CARRIER | | PLASTICS | FOUR SIDES J-SHAPE |

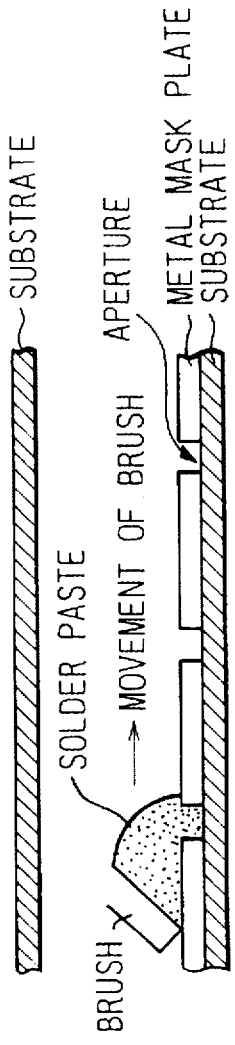
Fig.3A
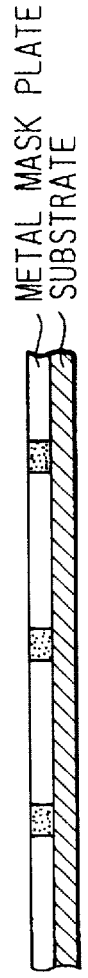
Fig.3B
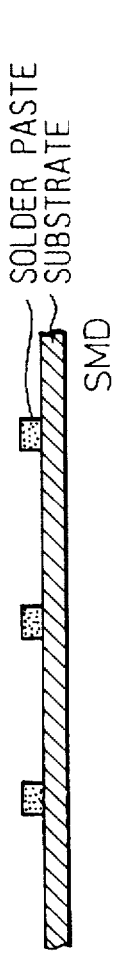
Fig.3C
Fig.3D
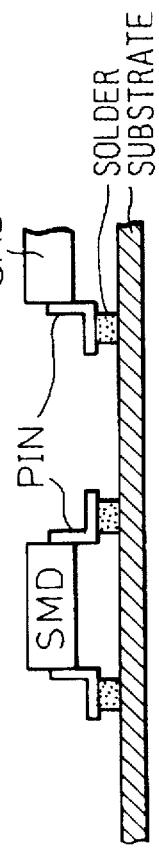
Fig.3E
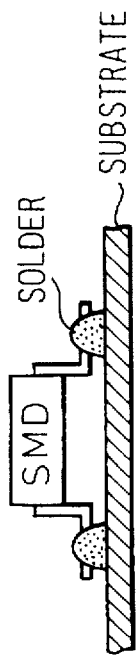
Fig.3F

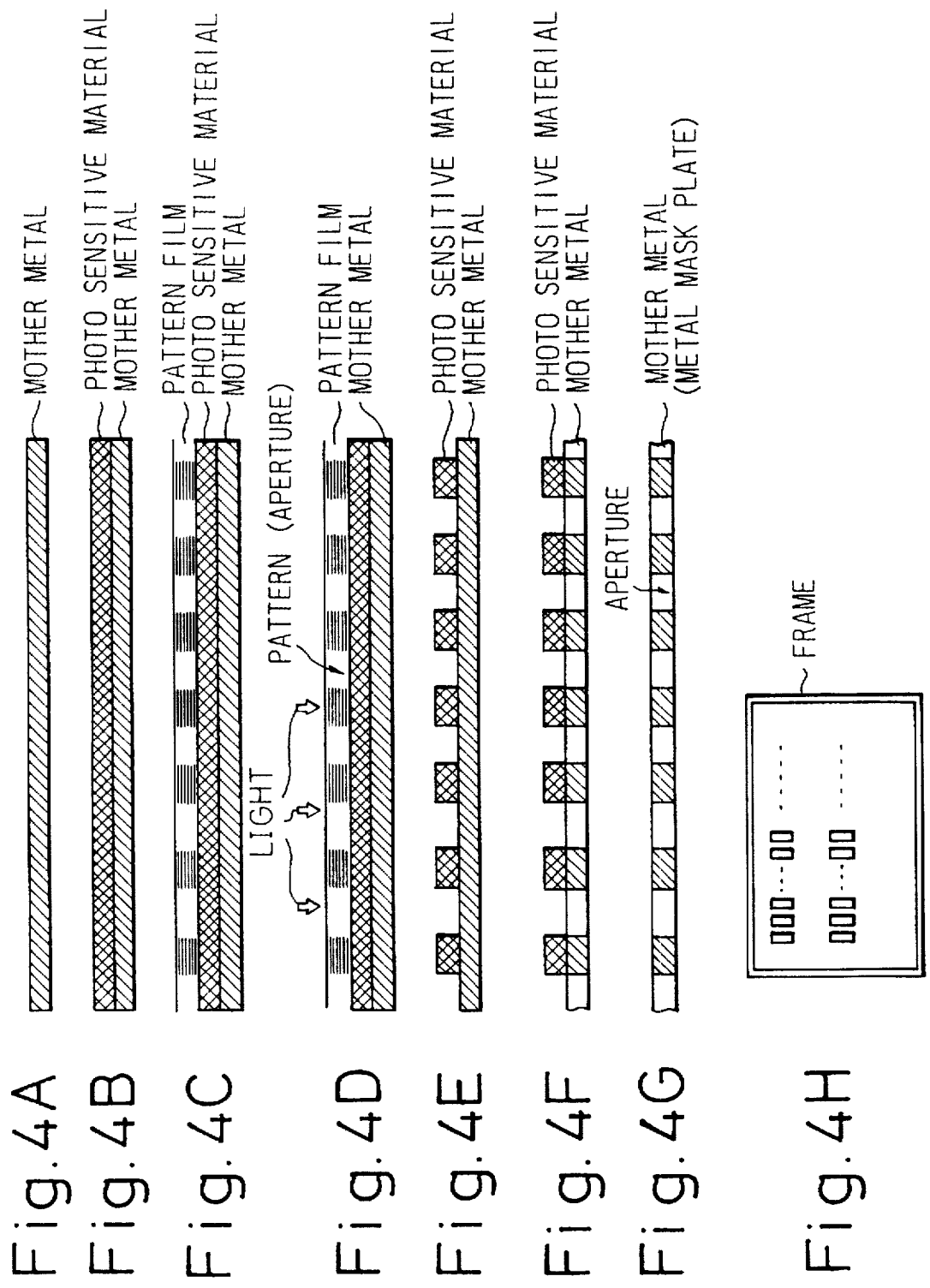

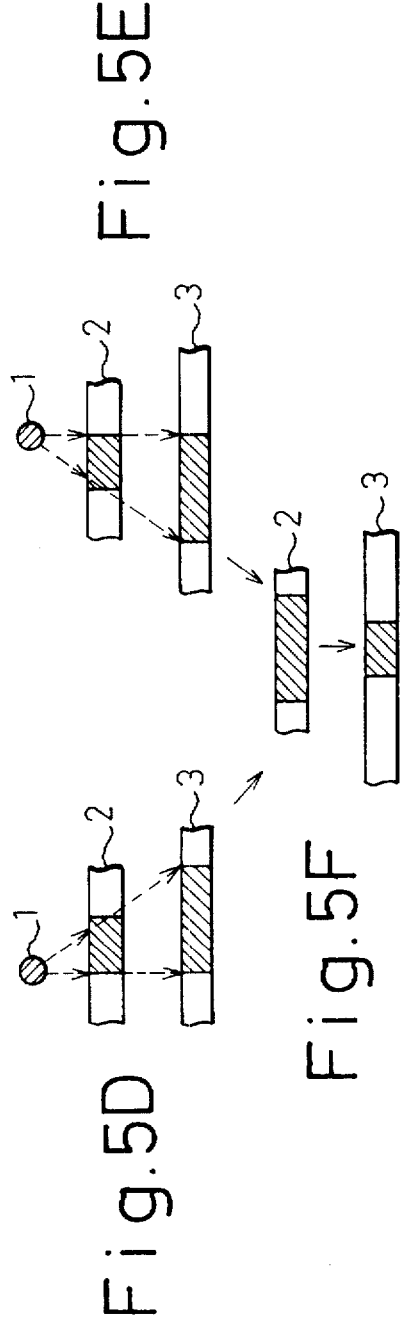

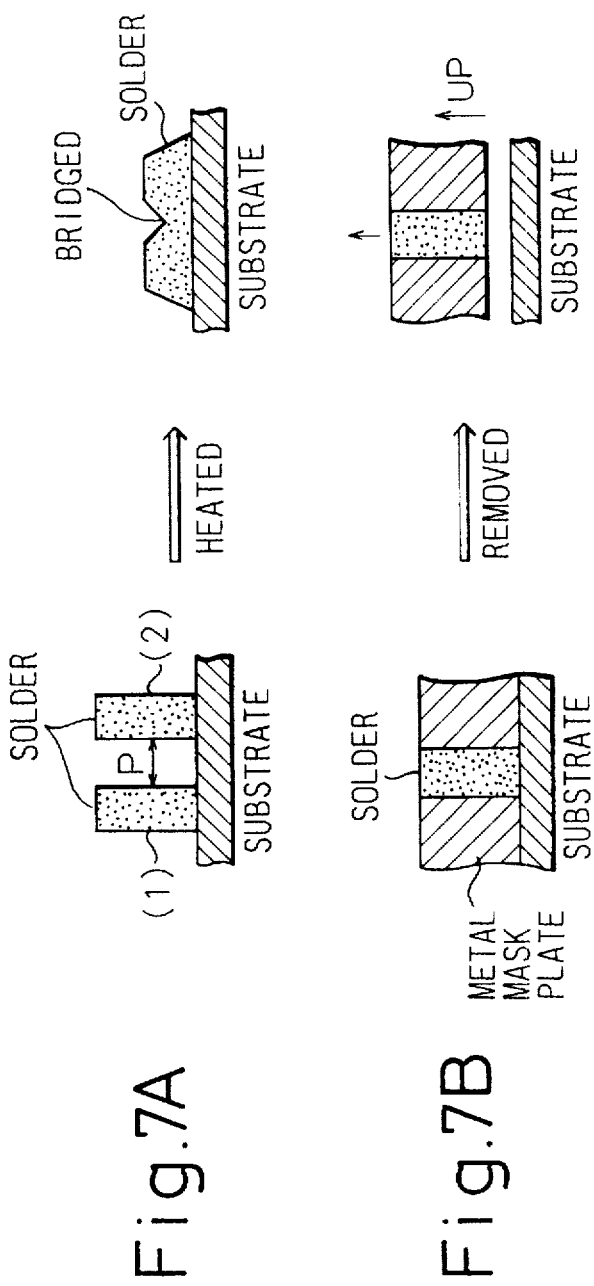

NC DATA FOR HALF-ETCHING

NC DATA FOR FOOT-PRINT SHAPE

FINAL FOOT-PRINT SHAPE

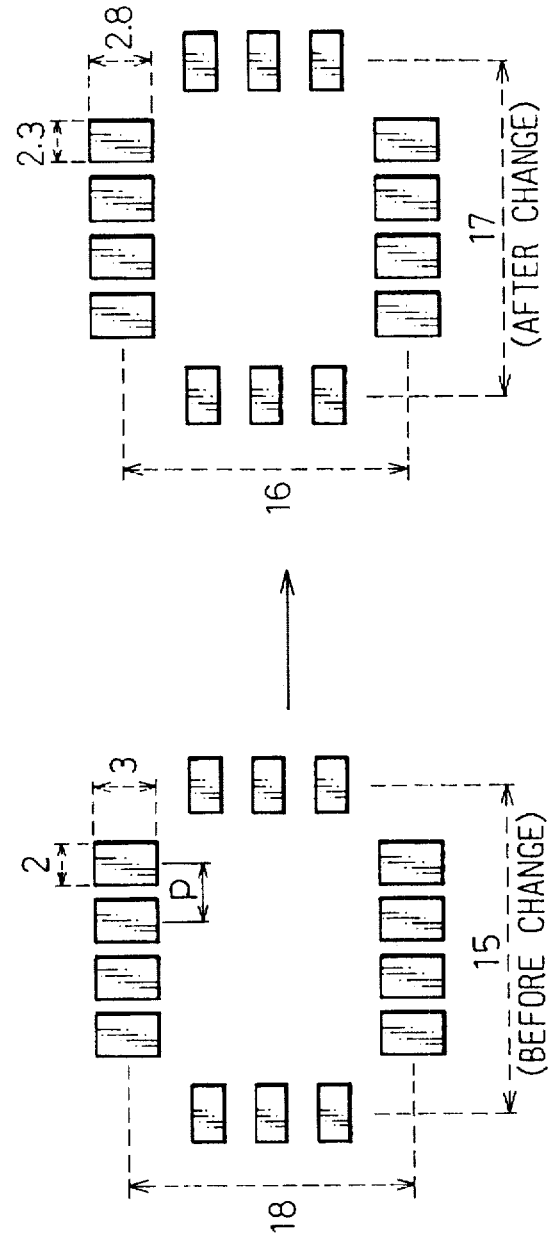

Fig. 18

| SPEC NAME | PARTS SORT NAME | PITCH | NUMBER OF PIN | FOOT-PRINT WIDTH | FOOT-PRINT LENGTH | MAXIMUM LENGTH | MAXIMUM WIDTH |
|---|---|---|---|---|---|---|---|
| ABC | QFP | 3.0 | 14 | 2.0 | 3.0 | 18.0 | 15.0 |

Fig. 19

REMODELING PARAMETER FILE (QFP1.PRM)

REMODELED UNIT:DEVICE
PARTS SORT:QFP

>Item,Pitch, Pin, Wi , Li , Ai , Bi , Wvo , Who , Lvo , Lho , Ao , Bo
 100 , 3.0 , 14 , 2.00, 3.00, 18.00, 15.00, 2.30, 2.30, 2.80, 2.80, 16.00, 17.00
  └(1)┴(2)┴(3)┴(4)┴(5)┴(6)┴(7)┴(8)┴(9)┴(10)┴(11)┴(12)

| REMODELING CODE | REMODELING UNIT | PARTS SORT NAME | REMODELING PARAMETER FILE |
|---|---|---|---|
| A | DEVICE | QFP | QFP1.FRM |
|   | DEVICE | SOP | SOP1.PRM |
|   | DEVICE | CHIP | CHIP1.PRM |
| B | DEVICE | QFP | QFP2.FRM |
|   | DEVICE | SOP | SOP2.PRM |
|   | DEVICE | CHIP | CHIP2.PRM |

|  | QFP | SOP | CHIP |
|---|---|---|---|
| KAIZOU 1 | REMODELING CODE A | REMODELING CODE B | NOT REMODELED |
| KAIZOU 2 | REMODELING CODE B | REMODELING CODE A | REMODELING CODE B |

PROCESS NAME

PRODUCTION DATA PREPARING SYSTEM FOR PRODUCING A METAL MASK PLATE

This application is a continuation of application Ser. No. 08/288,049, filed Aug. 10, 1994, now abandoned.

BACKGROUND OF THE INVENTION

1. Field of the Invention

The present invention relates to a production data preparing system for providing a metal mask plate which is used for soldering various SMDs (Surface Mounting Devices) onto a printed-circuit board. Particularly, the present invention aims to improve the preparation processes for a pattern film which is used for preparing the metal mask plate.

2. Description of the Related Art

Various SMDs are widely used on printed-circuit boards. This is because SMDs allow high density packaging on the printed-circuit board. Soldering processes for the SMDs on the printed-circuit board also employ the surface mounting technique (SMT). That is, the SMDs are soldered on the printed-circuit board using a metal mask plate which has a plurality of apertures provided in correspondence to the arrangement of the pins on the SMDs, i.e., each position of the aperture corresponds to a pin position on the SMD.

However, a conventional surface mounting technique requires a lot of manual work, particularly in the preparation of a pattern film which is used as an intermediate step for providing the metal mask plate. Accordingly, the present invention aims to reduce the manual work for preparing the metal mask plate and, particularly, to reduce the time required to prepare the pattern film.

SUMMARY OF THE INVENTION

The object of the present invention is to provide a production data preparing system for providing a metal mask plate which can reduce the manual work required to prepare a pattern film.

In accordance with the present invention, there is provided a production data preparing system for providing a metal mask plate used for soldering various SMDs (Surface Mounting Devices) on a printed-circuit board, including:

- a CAD file for storing production data for preparing the printed-circuit board, the production data including substrate data, packaging parts data and remodeling data for the SMD; the packaging parts data having parts-position data, pin-position data, and foot-print shape data;
- a foot-print shape storage unit operatively connected to the CAD file for storing target foot-print shape data extracted from the CAD file in order to change the foot-print shapes;
- a mounting parts data storage unit operatively connected to the CAD file for storing data, for target SMDS, extracted from the CAD file;
- a management table file for storing packaging parts attributes and foot-print shape changing rules, and relationships therebetween; and
- a preparation unit operatively connected to the foot-print shape storage unit, the mounting parts data storage unit and the management table file, for preparing production data used for providing the metal mask plate.

In a preferred embodiment, the management table file includes: a specification table for storing specification data of foot-print shapes; a parameter file for storing various sizes of the foot-print shape before and after change; a remodeling definition table for storing various remodeling/changing code data; and a process code table for storing process/production line names.

In another preferred embodiment, the preparation unit includes: a pattern processing unit for determining an amount of solder to be supplied on the metal plate, a change of the foot-print shape and movement of the foot-print shape; a data processing unit for preparing production data for the metal mask plate; and a controller for controlling operation of the pattern processing unit and the data processing unit in order to provide the production data.

In still another preferred embodiment, the production data preparing system further comprises an NC data file for storing data of half-etching process provided in processes for the metal mask plate, and data of the foot-print shape after change.

In still another preferred embodiment, the production data preparing system further comprises an aperture file for storing aperture data, which correspond to the foot-print shape data, provided on the metal mask plate.

In still another preferred embodiment, the specification table comprises the width, the length, the pitch between pins of the foot-print shape, and the number of pins of the SMD.

In still another preferred embodiment, the parameter file comprises a remodeling unit name of the SMD and a parts sort name of the SMD which indicates the type of the SMD.

In still another preferred embodiment, the remodeling definition table comprises remodeling codes which include remodeling unit of the SMD, parts sort name of the SMD and parameter file name.

In still another preferred embodiment, the process code table comprises the process names which include remodeling codes for each parts sort name.

BRIEF DESCRIPTION OF THE DRAWINGS

In the drawing:

FIGS. 3A to 3F show basic surface mounting processes of the SMD on a substrate;

FIGS. 4A to 4H show basic processes of preparation of a metal mask plate;

FIGS. 5A to 5F show basic processes of preparation of a pattern film;

FIGS. 7A and 7B are views for explaining problems in the surface mounting process;

3

Figures 15A, 15B:
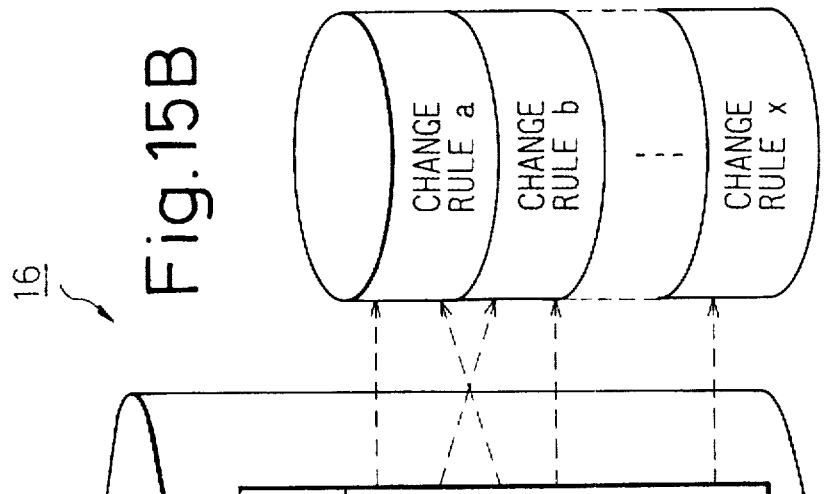
Figure 16A:
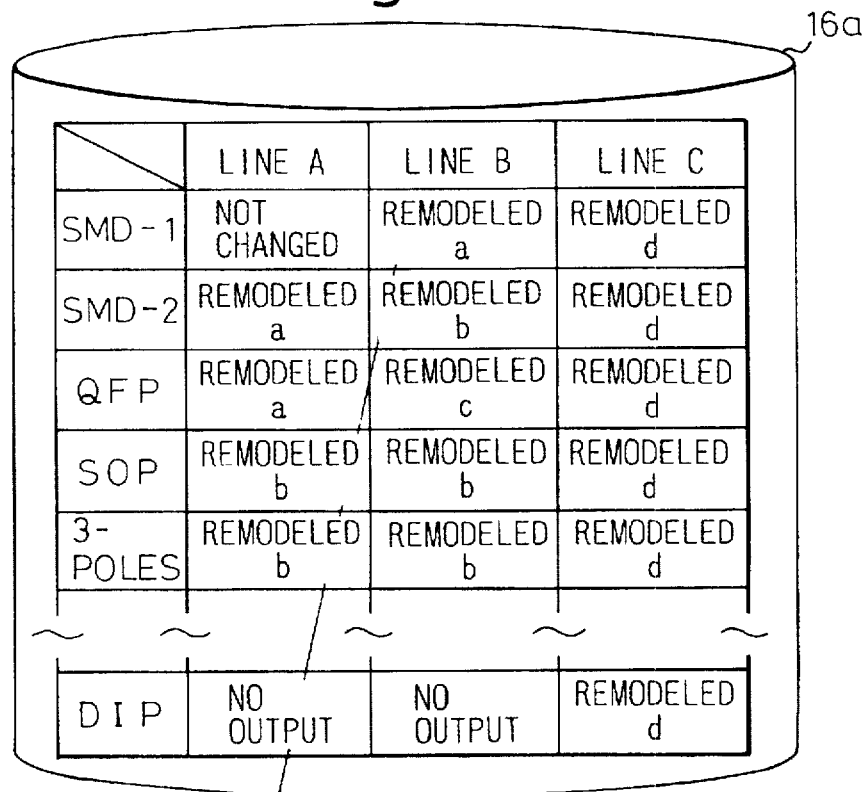
Figure 16B:
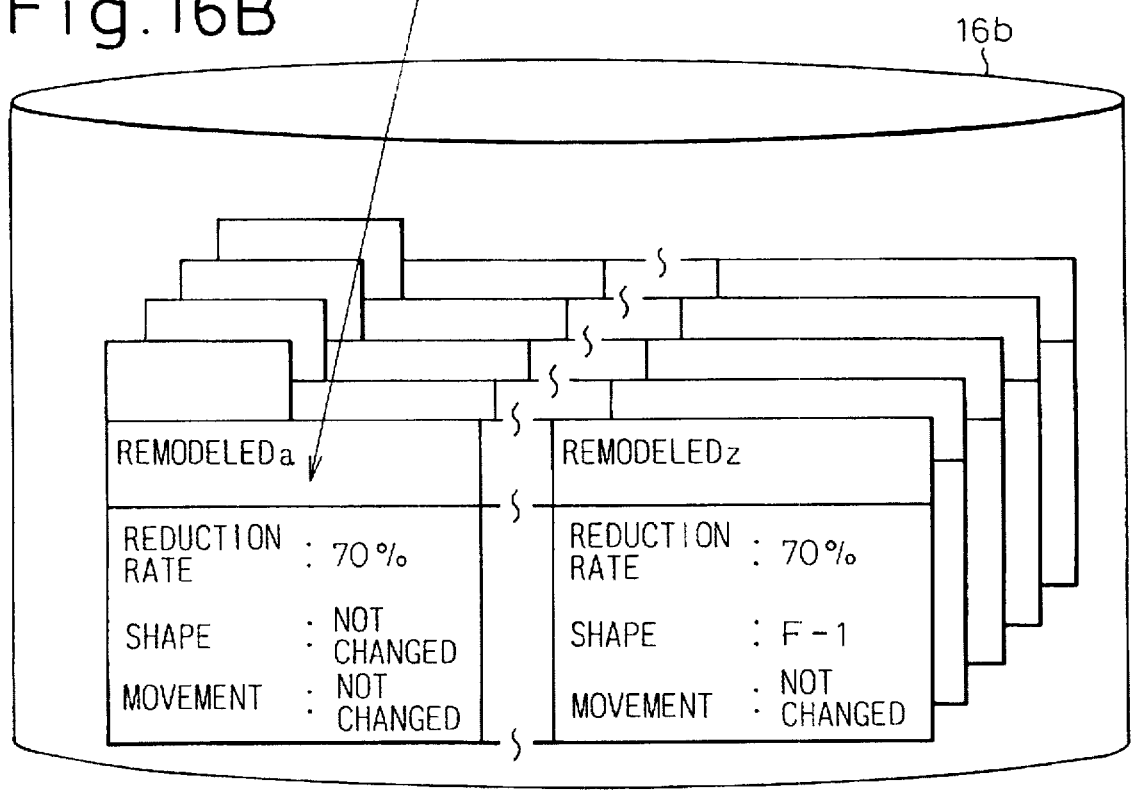
Figures 20, 21:
Figure 22:
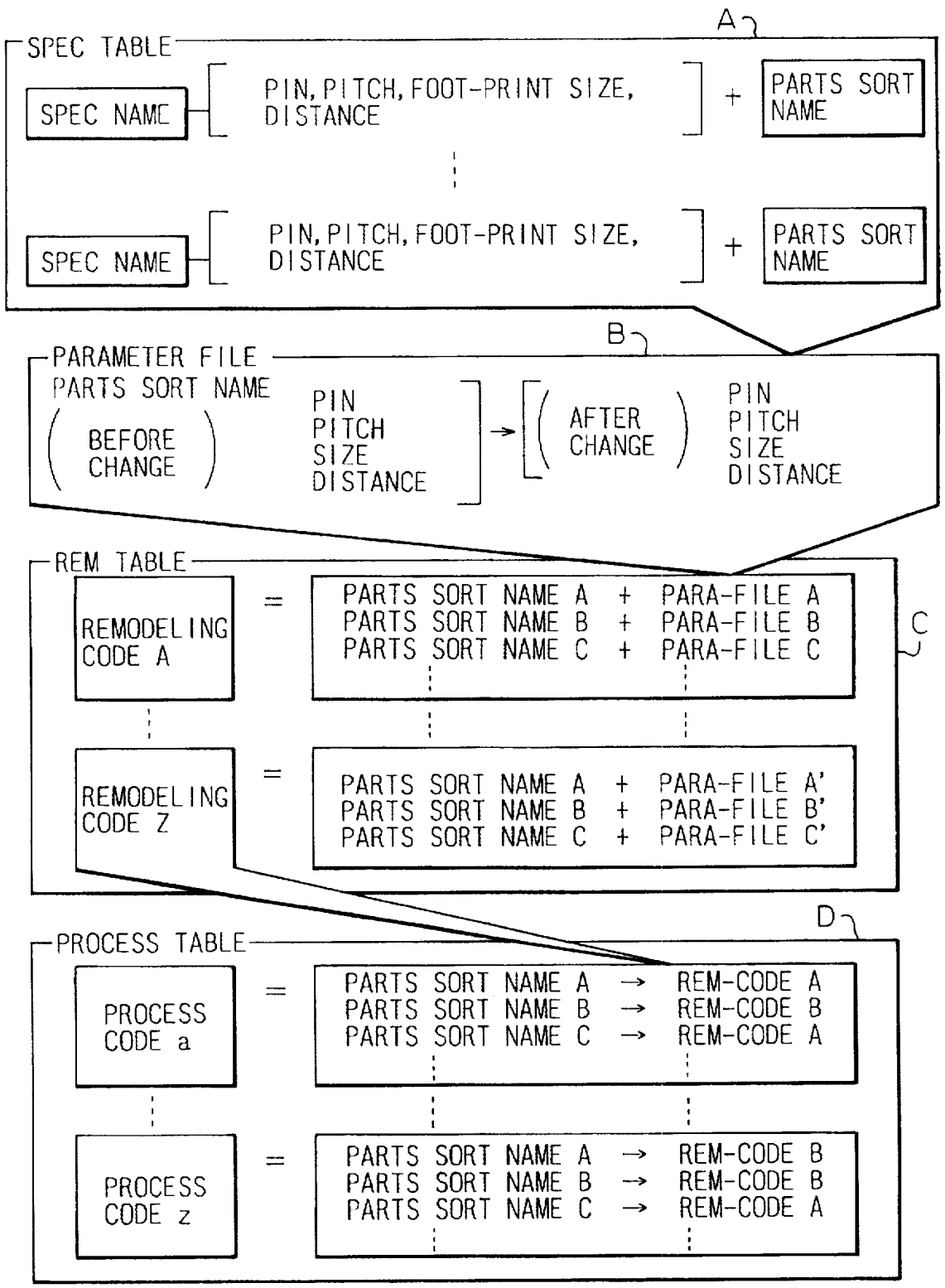

FIG. 15A shows one example of management data stored in a management table;

FIG. 15B shows a change rule file;

FIG. 16A is a view for explaining management data;

FIG. 16B shows one example of the change rule;

FIGS. 17A and 17B are views for explaining size of foot-print shapes before and after change;

FIG. 18 is a view for explaining registration of parts sort names;

FIG. 19 is a view for explaining a remodeling parameter file;

FIG. 20 is a view for explaining a remodeling specification;

FIG. 21 is a view for explaining a definition of the process;

FIG. 22 is an explanatory view of various tables; and

Figure 23:
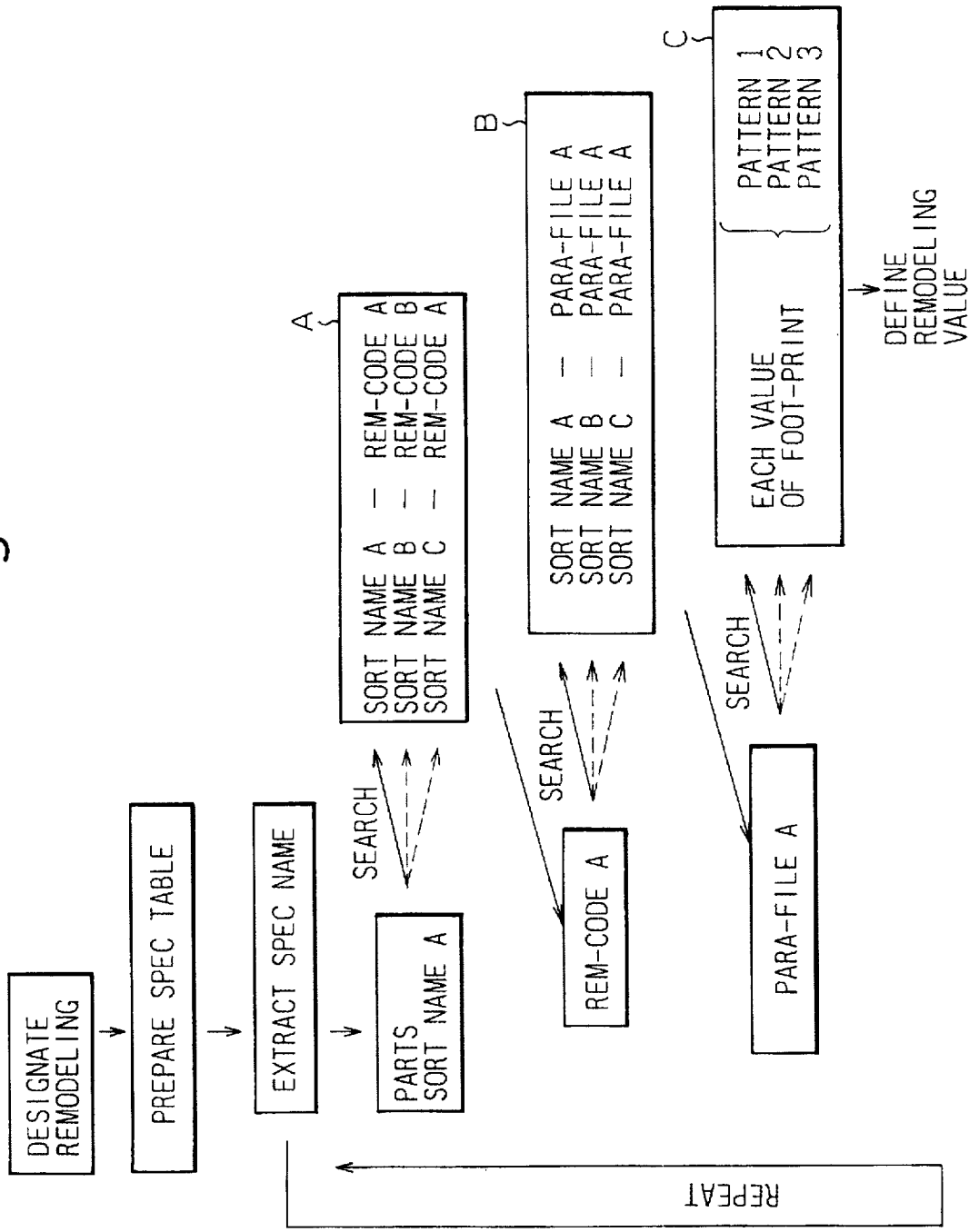

FIG. 23 is a flowchart for explaining change of file.

DESCRIPTION OF THE PREFERRED EMBODIMENTS

Before explaining the preferred embodiments, a conventional art and its problem will be explained in detail below.

Figures 1, 2:
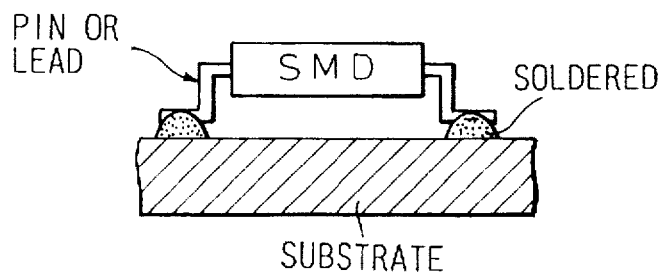
FIG. 1 is an explanatory view of an SMD.
FIG. 2 is an explanatory view of surface mounting type packages.

FIG. 1 is an explanatory view of an SMD. The SMD is a type of an electronic part, and has a plurality of pins or leads as shown in the drawing. In the SMD technique, these pins are directly soldered onto a substrate using a metal mask plate as explained below.

FIG. 2 is an explanatory view of surface mounting type packages. There are known four typical surface mounting packages as shown in the drawing. SOP (small outline package) uses a plastic package and has pins on two sides. An FPP (or QFP) (flat plastic package) has pins on four sides. LCC (leadless chip carrier) uses a ceramic package and has contacts on four sides. A PLCC (plastic leaded chip carrier) uses a plastic package and has J-shape contacts on four sides. The present invention relates to the SOP and QFP type packages.

FIGS. 3A to 3F show basic surface mounting processes of the SMD on the substrate. First, a substrate which is used for a printed-circuit board is provided as shown in FIG. 3A. Next, a metal mask plate having a plurality of apertures is provided on the substrate as shown in FIG. 3B. Further, solder paste is provided on the metal mask plate, and moved in the direction of the arrow using a brush. As a result, the solder paste is provided in the apertures as shown in FIG. 3C. After above process, the metal mask plate is removed from the substrate so that the solder paste remains on the substrate in correspondence to the positions of the apertures as shown in FIG. 3D. Further, the SMDs are mounted on the solder paste portions as shown in FIG. 3E. Finally, this assembly is heated in order to solder the SMD on the substrate as shown in FIG. 3F.

FIGS. 4A to 4H show basic processes of preparation of the metal mask plate. First, a mother metal, preferably, a steel, is provided as shown in FIG. 4A. Next, a photo sensitive material is painted on the substrate as shown in FIG. 4B. Further, a negative film, on which patterns have been developed in another process, is superimposed on the photo sensitive material as shown in FIG. 4C. In this case, the patterns correspond to the position of the apertures as shown in the drawing. This negative film is called "pattern film".

Next, the pattern film is exposed by light, as shown in FIG. 4D. After exposure, the pattern film is removed and the surface is washed. Accordingly, the photo sensitive material remains on the mother metal as shown in FIG. 4E. Further, in an etching process, the mother metal is removed except for the positions where the photo sensitive material remains, as shown in FIG. 4F. Further, the photo sensitive material is removed from the mother metal so that a plurality of apertures are provided on the mother metal as shown in FIG. 4G. Finally, a frame is provided around the mother metal so that the metal mask plate is completed as shown in FIG. 4H.

FIGS. 5A to 5F show basic processes of preparation of the pattern film. In the drawings, reference number 1 denotes a light source, 2 an original film, and 3 a pattern film. In FIGS. 5A and 5D, the light source 1 is rotated by an optical processing machine. The light source is positioned to the left side in FIGS. 5A and 5D, and to the right side in FIGS. 5B and 5E.

In FIGS. 5A to 5C, the original film 2 is negative, and the pattern film 3 is also negative. Accordingly, the negative pattern of the original film 2 is enlarged on the pattern film 3 as shown in FIGS. 5A and 5B so that it is possible to enlarge the pattern film as shown in FIG. 5C when these patterns are combined.

In FIGS. 5D to 5F, the original film 2 is positive, and the pattern film 3 is also positive. Accordingly, the positive pattern of the original film 2 is enlarged on the pattern film 3 as shown in FIGS. 5D and 5E. In FIG. 5F, since the original film 2 is negative, it is possible to reduce the pattern film, as was the positive film as shown in FIG. 5C, when these patterns are combined.

Figure 6A:
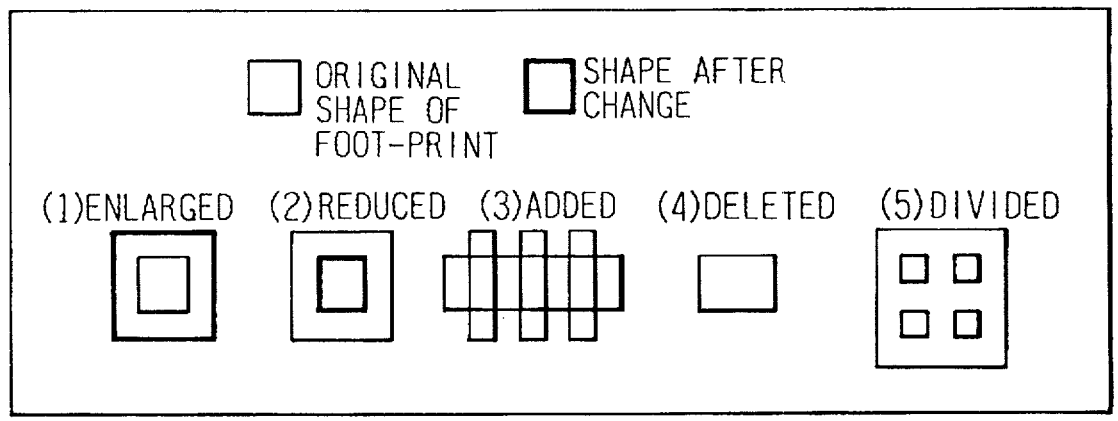
FIGS. 6A and 6B are views for explaining changes of foot-print shapes.
Figure 6B:
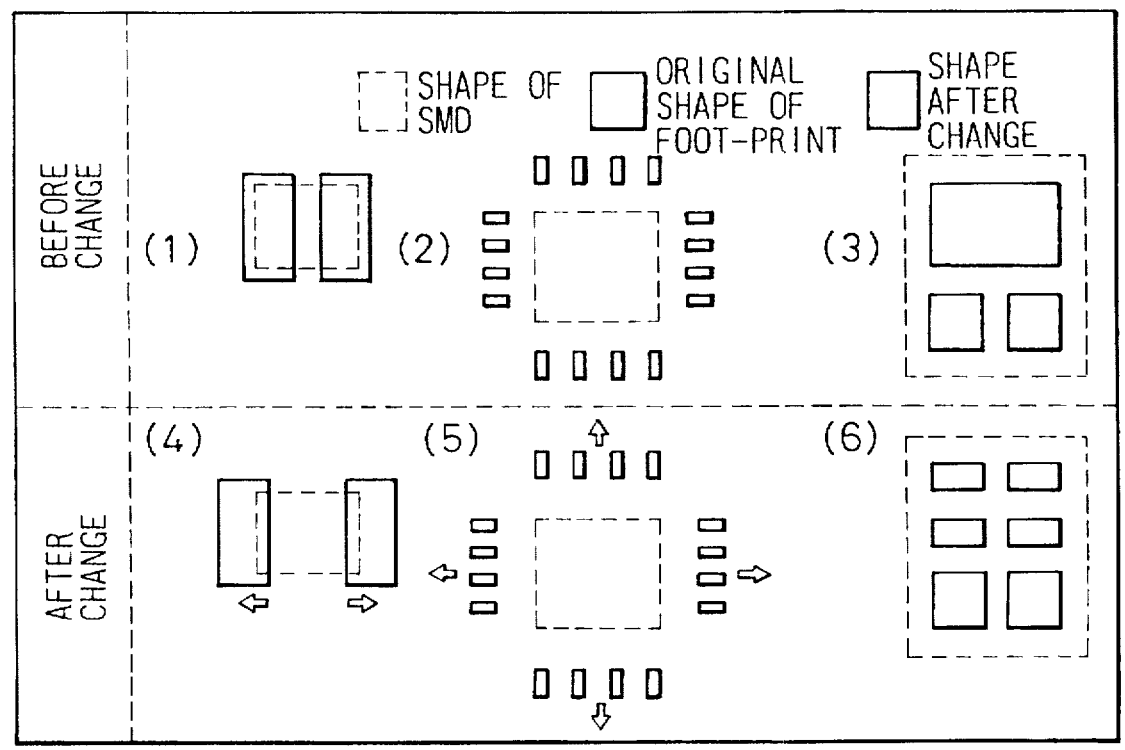

FIGS. 6A and 6B are views for explaining a change of foot-print shapes. Basically, the shape of the aperture is the same as the "foot-print shape". The change in the foot-print shape occurs in accordance with various conditions, for example, the shape of the pin, the pitch (or space) between pins, the numbers of the apertures, the production line of the printed-circuit board, and so forth.

In FIG. 6A, thin lines denote the original foot-print shape before change, and thick lines denote the foot-print shape after change. In this drawing, the change is performed for an individual foot-print shape. In the case of (1), the foot-print shape is enlarged, and in the case of (2), the foot-print shape is reduced. In the case (3), another pattern is added, and in the case of (4), the pattern is deleted. Further, in the case of (5), the original foot-print shape is divided into four patterns.

In FIG. 6B, dotted lines denote the shape of the SMD, thin lines denote the original foot-print shape, and thick lines denote the footprint shape after change. The numbers (1) to (3) denote the original foot-print shapes before change, and (4) to (6) denote the foot-print shapes after change. In the cases of (4) and (5), the foot-print shapes are moved in the directions of the respective, adjacent arrows in order to adjust the pin positions. In the case of (6), the foot-print shapes are further divided into six patterns.

FIGS. 7A and 7B are views for explaining problems in the surface mounting process. In FIG. 7A, this process corresponds to the process shown in FIGS. 3C and 3D. As shown in the left side of the drawing, two solder portions (1) and (2) are provided on the substrate. In this case, "p" is the pitch (space) between solder portions (1) and (2). In the next process, when the solder portions are heated in order to mount the SMD, the melted solder may bridge the gap so that these pins are electrically shorted. This problem can be caused by one of two reasons, i.e., the pitch "p" (space) between solder portions is too narrow, or the amount of the solder is too great. When the space is very narrow, the melted solder may bridge, and when the amount of solder is too great, the melted solder may bridge. Accordingly, it is necessary to adjust the pitch and the amount of solder.

In FIG. 7B, this process corresponds to the process shown in FIG. 3C. When the metal mask plate is removed from the substrate as shown in FIG. 3C, undesirably, the solder portion is also removed from the substrate with the metal mask plate. This can be caused by one of two reasons, i.e., the shape of an inside wall of the aperture or the amount of the solder. When the inside wall is not slightly tapered, it is very difficult to remove the solder from the metal mask plate. Further, when the amount of the solder is small, it is difficult to remove the solder from the metal mask plate because of the viscosity of the solder.

Figures 8A, 8B:
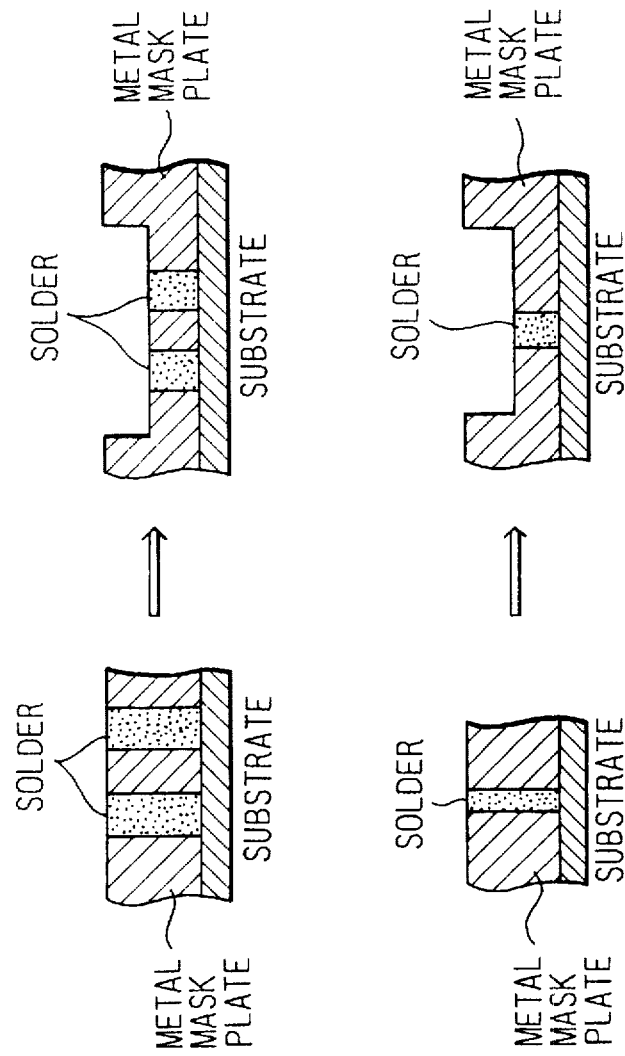
FIGS. 8A and 8B are explanatory views for adjusting an amount of solder.

FIGS. 8A and 8B are explanatory views for adjusting the amount of the solder, in order to provide countermeasures for above problems. As shown in FIGS. 8A and 8B, a hollow portion is provided on the metal mask plate by using a half-etching process. Accordingly, it is possible to reduce the amount of the solder in the hollow portion. As shown in FIG. 8B, further, the diameter of the aperture is extended so that it becomes easy to remove the metal mask plate from the substrate.

In a conventional art, although these problems have been resolved dependent on an operator's sequential checks, a lot of work is necessary to check the soldered portions. Accordingly, it is necessary to reduce the manual work in the preparation processes for the metal mask plate.

Figure 9:
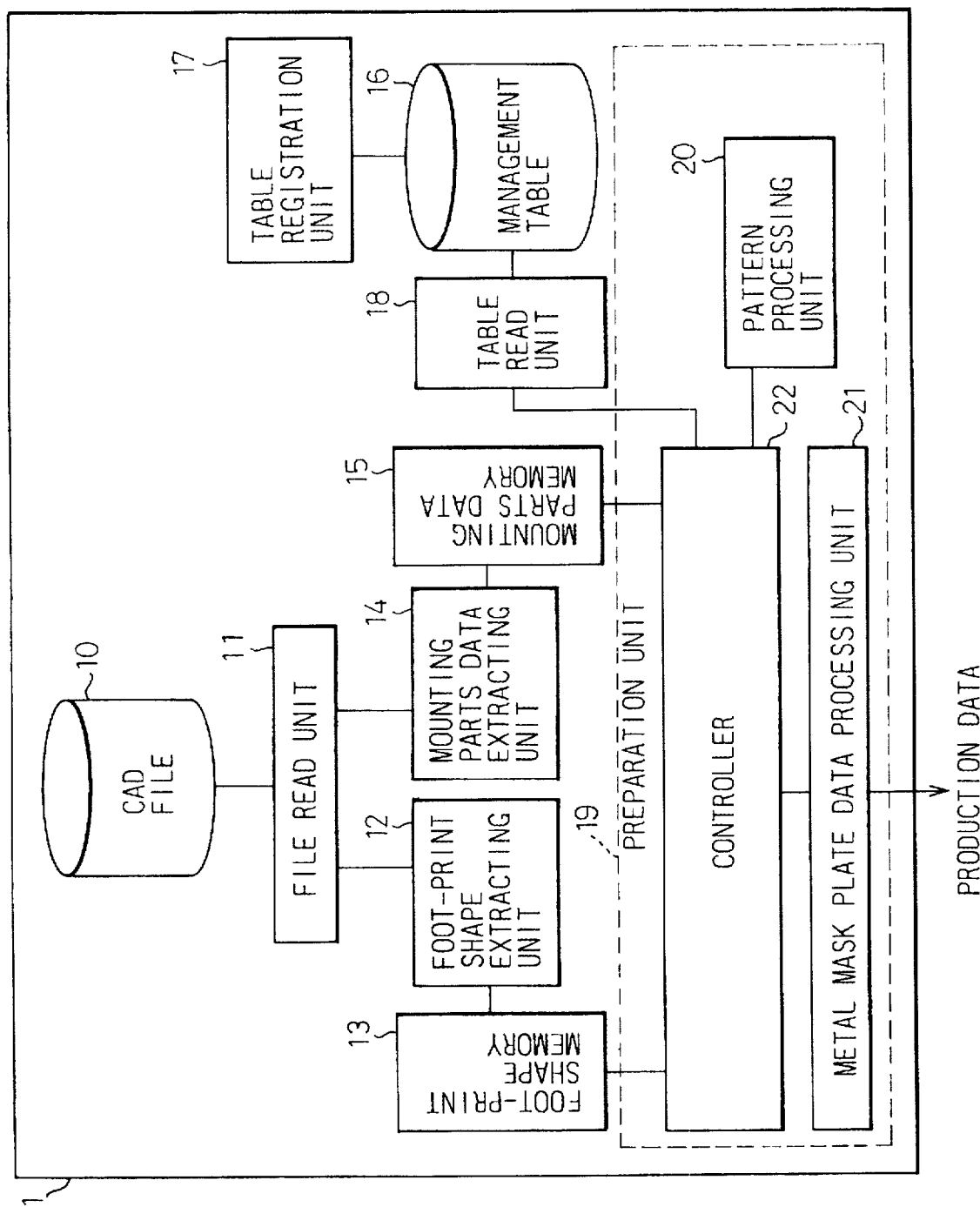
FIG. 9 is a basic block diagram of a production data preparing system according to the present invention.

FIG. 9 is a basic block diagram of a production data preparing system according to the present invention. In FIG. 9, a production data preparing system 1 includes a CAD file 10, a file read unit 11, a foot-print shape extracting unit 12, a foot-print shape memory 13, a mounting parts data extracting unit 14, a mounting parts data memory 15, a management table file 16, a table registration unit 17, a table read unit 18, and a preparation unit 19. The preparation unit 19 includes a pattern processing unit 20, a metal mask plate data processing unit 21, and a controller 22.

The CAD file 10 stores all production data regarding printed-circuit boards, for example, art work data, drill data, solder-resist data, and screen print data. The CAD file 10 further stores packaging data, for example, parts specification data, mounting position data, parts shape data, pin shape and position data, and data regarding change of shape.

The file read unit 11 reads data stored in the CAD file 10. The foot-print shape extracting unit 12 extracts the foot-print shape data from the file read unit 11. The foot-print shape memory 13 stores the foot-print shape data extracted by the foot-print shape extracting unit 12. The mounting parts data extracting unit 14 extracts the mounting parts data from the file read unit 11. The mounting parts data memory 15 stores the mounting parts data extracted by the mounting parts data extracting unit 14.

The management table file 16 stores attribute data for mounting parts, change rules for the foot-print shape, and the relationships between them. These relationships are defined for every production line of the metal mask plate. That is, the management table file 16 stores relationships between attribute data for mounting parts and the change rules of the foot-print shape, using key items, for example, the parts specification name, the foot-print shape, and the pin shape and position.

The table registration unit 17 registers production data, regarding the metal mask plate, into the management table file 16. The table read unit 18 reads the contents of the management table file 16.

The preparation unit 19 prepares various production data for the metal mask plate, for example, thickness, shape, aperture position, and so forth. The preparation unit 19 includes the pattern processing unit 20 which performs movement of the foot-print shape, the metal mask plate processing unit 21 which prepares NC (numerical control) data used for the pattern film, and the controller 22 for controlling operation of units 20 and 21.

Figure 10A:
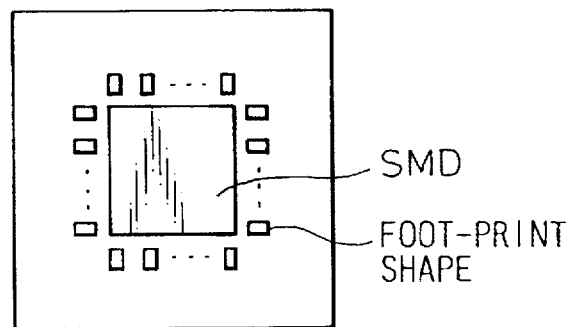
FIGS. 10A to 10C are explanatory views for determining the thickness of the metal mask plate.
Figure 10B:
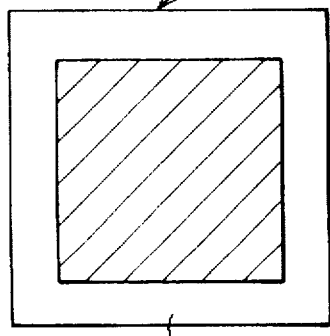
Figure 10C:
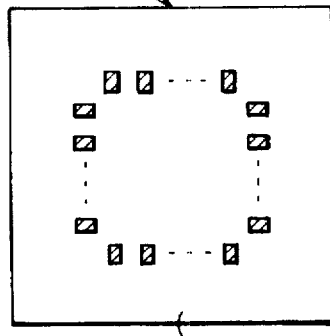

FIGS. 10A to 10C are explanatory views for determining thickness of the metal mask plate. FIG. 10A shows the SMD and foot-print shapes. FIG. 10B shows the NC data used for the half-etching process, and FIG. 10C shows the NC data used for the foot-print shapes. When it is necessary to partially provide a hollow on the metal mask plate in order to reduce an amount of the solder, the preparation unit 19 prepares the NC data used for the half-etching and the foot-print shape as explained in detail below.

Figure 11:
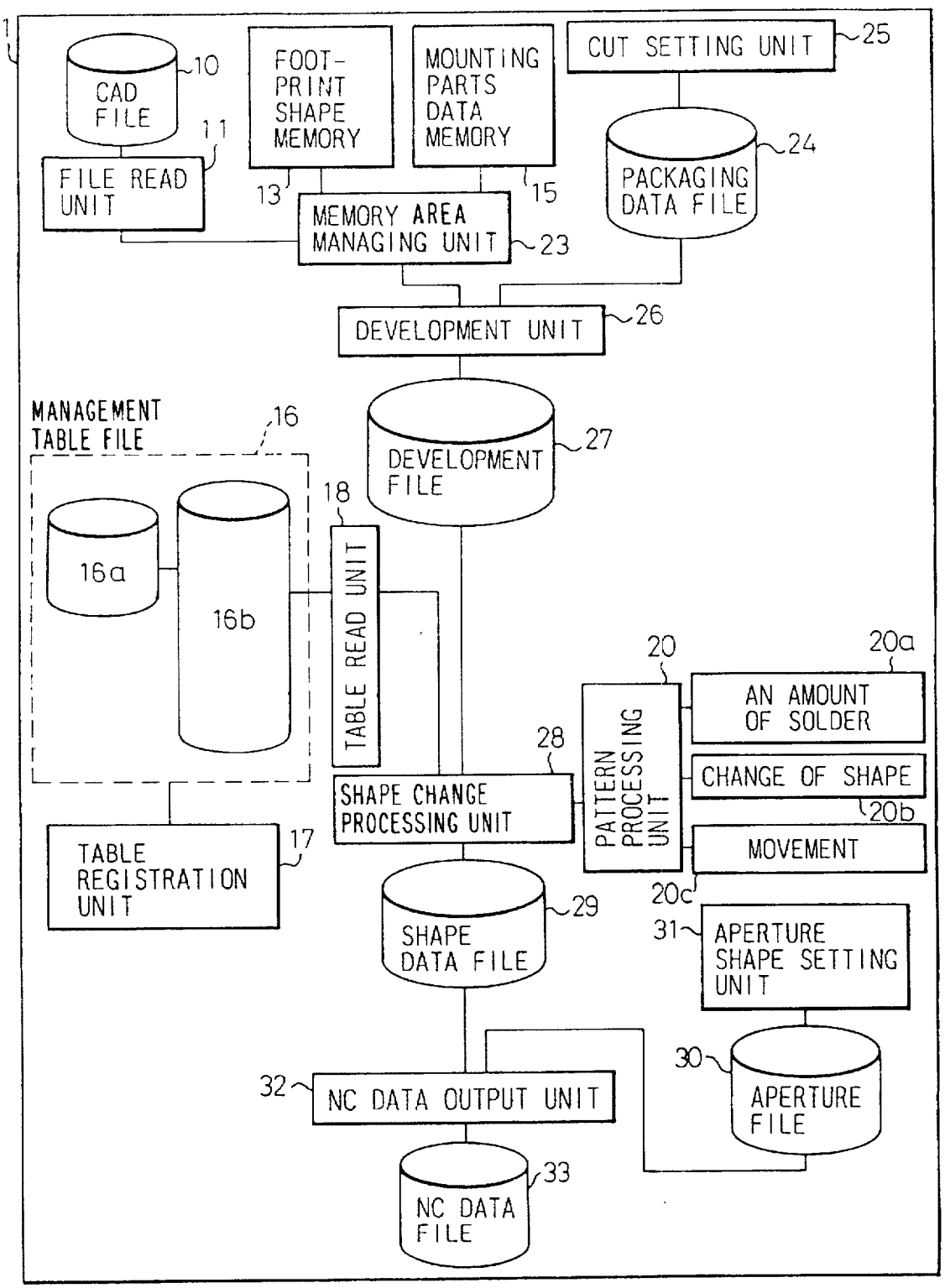
FIGS. 11 is a schematic block diagram of the production data preparing system according to the present invention.
Figure 12:
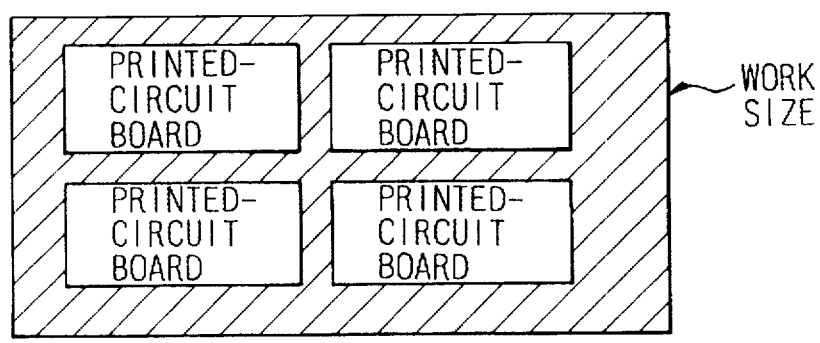
FIG. 12 is a view for explaining cutting-size on a printed-circuit board.

FIG. 11 is a schematic block diagram of the production data preparing system according to the present invention, and FIG. 12 is a view for explaining cutting-size on a printed-board. In addition to the structure shown in FIG. 9, the production data preparing system further includes a memory area managing unit 23, a packaging data file 24, a multi-faces (i.e., a multiple pattern) cut setting unit 25, a development processing unit 26, a development data file 27, a shape change processing unit 28, a shape data file 29, an aperture file 30, an aperture shape setting unit 31, an NC data output unit 32, and an NC data file 33.

The memory area managing unit 23 has two functions, i.e., a function for extracting the foot-print shape and a function for extracting the mounting parts data, and manages the foot-print shape memory 13 and the mounting parts data memory 15.

The packaging data file 24 stores the multi-faces (i.e., multiple pattern) cut setting data which are read from the multi-faces cut setting unit 25. That is, as shown in FIG. 12, a plurality of printed-circuit boards (four printed-circuit boards in this example) having the same size are simultaneously prepared from one mother board (work size) in order to realize effective production in an actual production line. Accordingly, a plurality of metal mask plates (four metal mask plates corresponding to four printed-circuit boards in this example) having the same size also must be provided for one mother metal in correspondence with the printed-circuit boards in the actual production line. The multi-faces cut setting unit 25 manages how to set a plurality of metal mask plates on one mother metal in accordance with the size of the board.

The development unit 26 develops the multi-faces (i.e., the multiple pattern) cut setting data on the mother metal. The development file 27 stores the multi-faces (i.e., the multiple pattern) cut setting data developed for the board. The shape changing unit 28 determines the foot-print shape before and after change. The shape data file 29 stores the foot-print shape data before and after change.

The aperture file 30 stores various shape data of the apertures used in the processes for preparing the pattern film. That is, the shape data of the aperture used for preparing the pattern film in the optical processing machine as shown in FIG. 5A. Further, the aperture shape setting unit 31 registers various shape data of the aperture into the aperture file 30 as shown in FIGS. 13A to 13C.

Figure 13A:
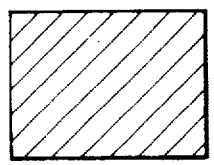
FIGS. 13A to 13C are views for explaining a preparation process of the foot-print shape on the pattern film.
Figure 13B:
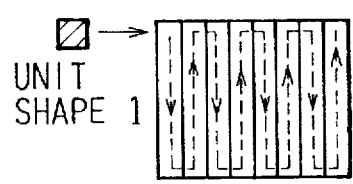
Figure 13C:
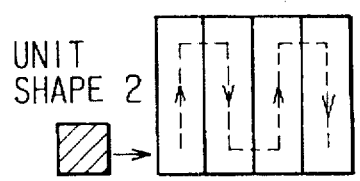

FIGS. 13A to 13C are views for explaining preparation process of the foot-print shape on the pattern film. FIG. 13A shows a foot-print shape on the pattern film, FIG. 13B shows one example of a unit shape of the foot-print shape and a moving trace thereof (dotted line), and FIG. 13C shows another example of a unit shape of the foot-print shape and a moving trace thereof (dotted line).

In FIG. 13A, this foot-print shape shows the complete shape on the pattern film. In FIGS. 13B and 13C, the unit shapes 1 and 2 are determined in accordance with the original shape of the foot-print, and are moved by the optical processing machine along the dotted line to prepare the foot-print shape shown in FIG. 13A. The optical processing machine is moved in accordance with the NC data shown in FIGS. 10B and 10C. As is obvious, the size of the unit shape 1 is smaller than that of the unit shape 2. Accordingly, when using the small unit shape, the moving trace becomes long. On the contrary, when using the large unit shape, the moving trace becomes short. The small unit shape is used when the foot-print shape is complicated.

The NC data output unit 32 (see, FIG. 11) reads the optimum shape of the aperture from the aperture file 30, and determines the unit shape and the moving trace. The NC data file 33 stores the NC data.

The management table file 16 manages relationships between the mounting parts attributes and the change rules of the foot-print shape, for every production line of the metal mask plate. This is because, when the production line is different, it is necessary to adapt another change rule of the foot-print shape even if the same foot-print shape is prepared. Regarding the management table 16, the detailed explanation will be given with reference to FIGS. 15 to 23 below.

Figure 14:
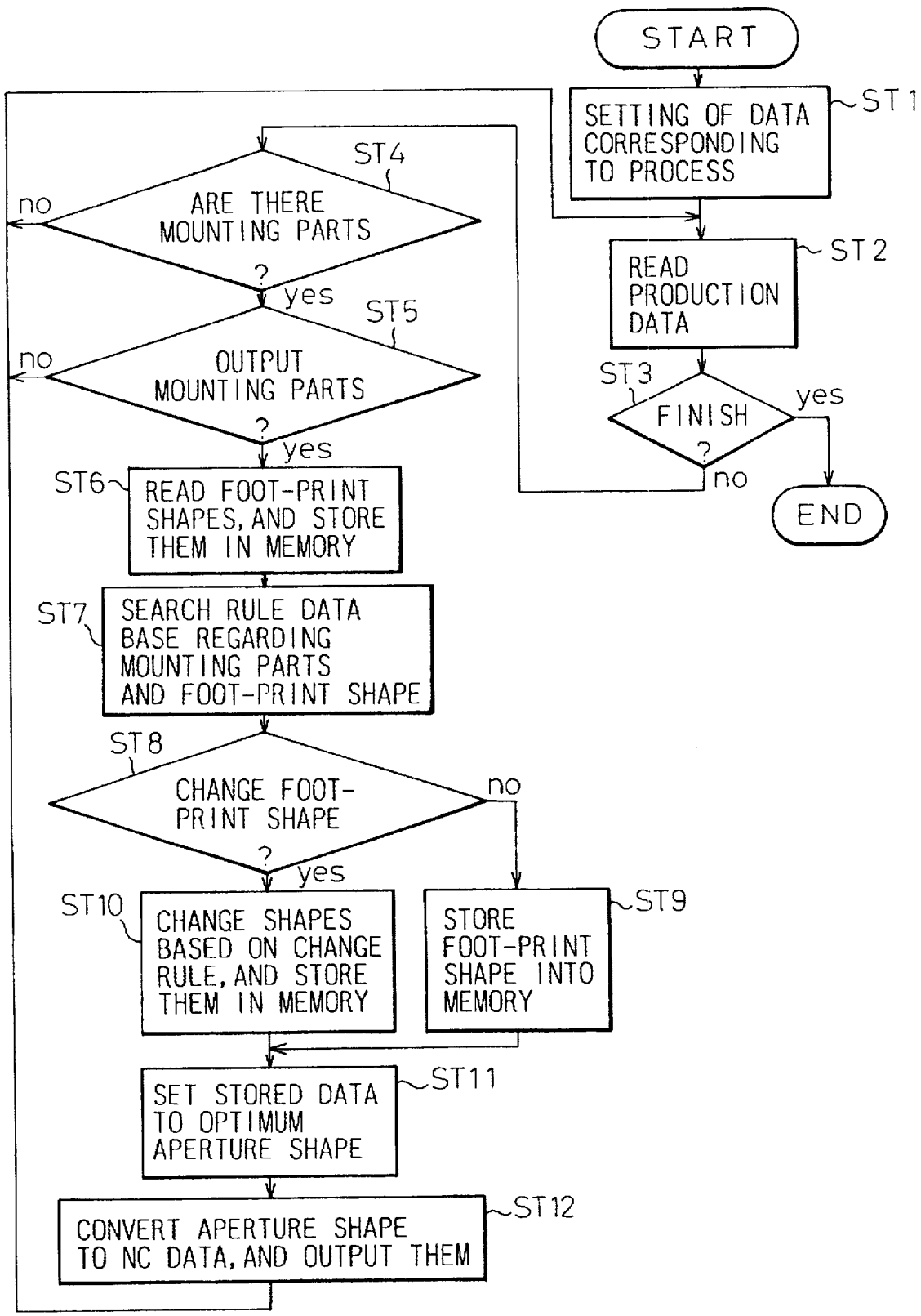
FIGS. 14 is a basic process flowchart of the production data preparing system according to the present invention.

FIG. 14 is a basic process flowchart of the production data preparing system according to the present invention.

In step ST1, when the production data preparing system receives a request of preparation of the metal mask plate, the table registration unit 17 sets the data corresponding to the process (i.e., the production line) into the management table file 16. That is, data regarding the production line for the metal mask plate are registered into a definition table 16a (see, FIG. 16).

In step ST2, the file read unit 11 reads the printed-board production data which are stored in the CAD file 10.

In step ST3, the file registration unit 17 determines whether all printed-circuit board production data has been read from the CAD file 10. When all data are read (YES), the process is completed. When all data are not read (NO, in step ST3), the process moves to the next step.

In step ST4, when the printed-board production data is read in step ST3, the management processing unit 23 determines whether the read data is the mounting parts data. When it is not the mounting parts data (NO), the process returns to the step ST2.

In step ST5, when the read data is the mounting parts data (YES, in step ST4), the management processing unit 23 determines whether the output of the read data is necessary. When the output is not necessary (NO), the process returns to the step ST2.

In step ST6, when the output of the read data is necessary (YES, in step ST5), the foot-print shapes corresponding to the mounting parts are read from the CAD file 10 and temporarily stored in the mounting parts data memory 15.

In step ST7, the packaging parts attribute of the mounting parts is used as a search key, and the management data, which form the data base of the change rule of the foot-print shape, are searched in order to define the change rule to be applicable to the foot-print shape. That is, as explained in detail below, the mounting parts specification, the foot-print shape, and shape sorting are used as the search key in order to search the management data. As a result, it is possible to define the change rule to be applicable to the foot-print shape aimed.

In step ST8, the shape changing unit 28 refers to the management data in the management table 16, and determines whether the defined change rule designates the change of the foot-print shape.

In step ST9, when the change rule does not designate the change (NO), the foot-print shape is stored in the memory without change.

In step ST10, when the change rule designates the change (YES), the shape changing unit 28 changes the foot-print shape in accordance with the change rule of the foot-print shape, and stores it into the memory.

In step ST11, after completion of steps ST9 and ST10, the aperture shape setting unit 31 refers to the management data in the aperture file 30, and sets an optimum aperture shape.

In step ST12, the NC data output unit 32 converts the foot-print shape into the NC (numerical control) data for driving the optical processing machine shown in FIGS. 5A to 5F. The NC data will be explained in detail below.

FIG. 15A shows one example of management data stored in a management table, and FIG. 15B shows a change rule file. In FIG. 15A, the parts specification (PARTS SPEC), the foot-print shape and the shape sort denote the key item of the packaging parts attribute. For example, when the parts specification SPEC A is the SMD resister, when the foot-print shape is given by "0001", and when the shape sort is "QFP" having pins on four sides, the change rule "a" is adapted in the change rule file in FIG. 15B in accordance with a link pointer No. 1. The SMD resister corresponds to "SMD-1" in FIG. 16A, and the change rule "a" corresponds to a remodeled "a" in FIG. 16B.

FIG. 16A is a view for explaining management data, and FIG. 16B shows one example of the change rule. In FIG. 16A, lines A to C denote production lines. SMD-1 denotes, for example, an SMD resistor. SMD-2 denotes, for example, an SMD capacitor. For example, the SMD resistor (SMD-1) is not changed in the production line A, but changed in production line B based on remodeled "a" (i.e., change rule "a"). Further, the SMD resistor is changed in the production line C based on remodeled "d" (i.e., change rule "d").

In FIG. 16B, for example, the SMD resistor SMD-1 is remodeled by the change rule "a". That is, in the preparation process of the pattern film, according to the remodeled "a", the foot-print shape of the SMD resistor is reduced based on the reduction rate 70%. However, the foot-print shape is not changed, and the foot-print position is also not changed. As another example, according to the remodeled "z", the foot-print shape of the SMD resistor is reduced based on the reduction rate 70%, and the foot-print shape is changed to a pattern F-1. However, the foot-print position is not changed.

FIGS. 17A and 17B are views for explaining size of foot-print shapes before and after change. As is obvious, this type SMD is the QFP having pins on four sides. FIG. 17A shows the shape before change, and FIG. 17B shows the shape after change. As shown in the drawings, the foot-print shape is given by (2×3) before the change, but it is changed to (2.3×2.8) after the change. Further, the height is reduced from "18" to "16", and the width is enlarged from "15" to "17". Still further, the symbol "p" denotes pitch between the foot-print shapes (between centers).

FIG. 18 is a view for explaining registration of parts sort names. In the drawing, the specification name is, for example, "ABC". The parts sort name is "QFP". The pitch, number of pins, width, length, maximum length, and maximum width are registered in the specification table shown in FIG. 22.

FIG. 19 is a view for explaining the remodeling parameter file. In this case, the file name is given by "QFP1.PRM", the remodeling unit name is given by "DEVICE", and the parts sort name is given by "QFP". The numerals from (3) to (6) show sizes before change, and the numerals from (7) to (12) show sizes after change.

FIG. 20 is a view for explaining the remodeling specification. The remodeling codes are given by "A" and "B". The remodeling unit DEVICE is shown in FIG. 19. The parts sort names GFP, SOP and CHIP are shown in FIG. 2. Further, the remodeling parameter file "QFP1.PRM" is shown in FIG. 19.

FIG. 21 is a view for explaining definition of the process. In the drawing, "KAIZOU-1" and "KAIZOU-2" denote the process name. The remodeling codes A and B are shown in FIG. 20. For example, in KAIZOU-1, the device QFP is remodeled based on the remodeling code A, and the device B is remodeled based on the remodeling code B. However, the device CHIP is not remodeled.

FIG. 22 shows examples of various tables, i.e., a specification table (A), a parameter file (B), a remodeling definition table (C), and a process code definition table (D).

The specification table (A) corresponds to the structure of FIG. 18. That is, the specification table is formed by spec-name, various sizes (for example, pitch, distance, foot-print size, etc.) and part sorts name. The parameter file (B) corresponds to the structure of FIG. 19, and is formed by the sizes before/after change. The remodeling definition table (C) corresponds to the structure of FIG. 20. For example, the remodeling code A is formed by the parts sort names A, B, C, ... and the parameter files A, B, C, ...

The process code table (D) corresponds to the structure of FIG. 21. The process code "a" is formed by the parts sort names A, B, C, ... and the remodeling codes A, B, ...

As shown in the drawings, the remodeling code A of the process table (D) corresponds to that of the remodeling definition table (C). The parameter file of the remodeling table (C) corresponds to that of parameter file (B).

FIG. 23 is a flowchart for explaining a change of file. First, the operator designates the remodeling, the size, searches the specification table (A) of FIG. 22, and extracts the specification name. When the operator finds the parts sort name, he searches the remodeling code from the parts sort name. Next, when the operator finds the remodeling code, he searches the parameter file. Next, when the operator finds the parameter file, he searches the foot-print values so that it is possible to define the remodeling values.

We claim:

1. A production data preparing system for producing a metal mask plate used for soldering surface mounting devices (SMDs) on a printed-circuit board, comprising:

a CAD file for storing production data for preparing the printed-circuit board, the production data including substrate data, packaging parts data and remodeling data of the SMD, and the packaging parts data comprising parts-position data, pin-position data, and foot-print shape data;

foot-print shape storage means operatively connected to the CAD file, for storing target foot-print shape data extracted from the CAD file in order to change the foot-print shapes;

mounting parts data storage means operatively connected to the CAD file for storing data of target SMDs extracted from the CAD file;

a management table file for storing packaging parts attributes and foot-print shape changing rules, and relationships therebetween; and preparation means operatively connected to the foot-print shape storage means, the mounting parts data storage means and the management table files for preparing production data used for providing the metal mask plate, said preparation means further comprising a pattern processing unit for determining at least one of an amount of solder to be supplied on the metal mask plate, a chance of the foot-print shape and movement of the foot-print shape, said preparation means further comprising a data processing unit for preparing production data for the metal mask plate; and a controller for controlling operation of the pattern processing unit and the data processing unit in order to provide the production data.

2. A production data preparing system as claimed in claim 1, wherein said management table file includes:

a specification table for storing specification data of foot-print shapes, a parameter file for storing various sizes of foot-print shapes before and after change, a remodeling definition table for storing various remodeling/changing code data, and a process code table for storing process/production line names.

3. A production data preparing system as claimed in claim 1, wherein said pattern processing unit determines each of an amount of solder to be supplied on the metal mask plate, a change of the foot-print shape and movement of the foot-print shape.

4. A production data preparing system as claimed in claim 1, further comprising an NC data file for storing data for a half-etching process, provided in processes for producing the metal mask plate, and data of each changed foot-print shape.

5. A production data preparing system as claimed in claim 1, further comprising an aperture file for storing aperture data, which corresponds to the foot-print shape data, of apertures provided on each metal mask plate.

6. A production data preparing system as claimed in claim 2, wherein said specification table comprises data specifying the width, the length, the pitch between pins of the foot-print shape, and the number of pins of the SMD.

7. A production data preparing system as claimed in claim 2, wherein said parameter file comprises a remodeling unit name of the SMD and the parts sort name, which indicates a type of the SMD.

8. A production data preparing system as claimed in claim 2, wherein said remodeling definition table comprises remodeling codes which include a remodeling unit name of the SMD, a parts sort name which indicates the type of the SMD and a parameter file name.

9. A production data preparing system as claimed in claim 2, wherein said process code table comprises the process names which include remodeling codes of each parts sort name which indicates the type of the SMD.

10. A production data preparing system for producing a metal mask plate used for soldering surface mounting devices (SMDs) on a printed-circuit board, comprising:

a CAD file storing production data for preparing the printed-circuit board, the production data including substrate data, packaging parts data and remodeling data of the SMDs, and the packaging parts data comprising parts-position data, pin-position data, and foot-print shape data;

a foot-print shape storage unit, operatively connected to the CAD file, storing target foot-print shape data extracted from the CAD file in order to change the foot-print shapes;

a mounting parts data storage unit, operatively connected to the CAD file, storing data of target SMDs extracted from the CAD file;

a management table file storing packaging parts attributes and foot-print shape changing rules and relationships therebetween; and a preparation unit operatively connected to the foot-print shape storage unit, the mounting parts data storage unit and the management table file, the preparation unit preparing production data used for providing the metal mask plate and further comprising:

a pattern processing unit determining at least two of:
i. an amount of solder to be supplied on the metal mask plate,
ii. a change of the foot-print shape, and
iii. movement of the foot-print shape, a data processing unit preparing production data for the metal mask plate, and a controller controlling operation of the pattern processing unit and the data processing unit in order to provide the production data.

11. A production data preparing system as recited in claim 10, wherein the pattern processing unit determines an amount of solder to be supplied on the metal mask plate and a change of the foot-print shape.

12. A production data preparing system as recited in claim 10, wherein the pattern processing unit determines an amount of solder to be supplied on the metal mask plate and movement of the foot-print shape.

13. A production data preparing system as recited in claim 10, wherein the pattern processing unit determines a change of the foot-print shape and movement of the foot-print shape.

14. A production data preparing system as recited in claim 10, wherein the pattern processing unit determines each of an amount of solder to be supplied on the metal mask plate, a change of the foot-print shape and movement of the foot-print shape.

15. A production data preparing system for producing a metal mask plate used for soldering surface mounting devices (SMDs) on a printed-circuit board, comprising:

a CAD file storing production data for preparing the printed-circuit board, the production data including substrate data, packaging parts data and remodeling data of the SMDs, and the packaging parts data comprising parts-position data, pin-position data, and foot-print shape data;

a foot-print shape storage unit, operatively connected to the CAD file, storing target foot-print shape data extracted from the CAD file in order to change the foot-print shapes;

a mounting parts data storage unit, operatively connected to the CAD file, storing data of target SMDs extracted from the CAD file;

a management table file storing packaging parts attributes and foot-print shape changing rules and relationships therebetween; and a preparation unit operatively connected to the foot-print shape storage unit, the mounting parts data storage unit and the management table file, the preparation unit preparing production data used for providing the metal mask plate and further comprising:

a pattern processing unit determining at least one of:
i. an amount of solder to be supplied on the metal mask plate, and
ii. a change of the foot-print shape, a data processing unit preparing production data for the metal mask plate, and a controller controlling operation of the pattern processing unit and the data processing unit in order to provide the production data.

16. A production data preparing system as recited in claim 15, wherein the pattern processing unit determines the amount of solder to be supplied on the metal mask plate.

17. A production data preparing system as recited in claim 15, wherein the pattern processing unit determines a change of the foot-print shape.

18. A production data preparing method for producing a metal mask plate used for soldering surface mounting devices (SMDs) on a printed-circuit board, comprising:

storing production data for preparing the printed-circuit board in a CAD file, the production data including substrate data, packaging parts data and remodeling data of the SMDs, and the packaging parts data comprising parts-position data, pin-position data, and foot-print shape data;

storing target foot-print shape data, extracted from the CAD file, in a foot-print shape storage unit, operatively connected to the CAD file in order to change the foot-print shapes;

storing data target SMDs extracted from the CAD file in a mounting parts data storage unit, operatively connected to the CAD file;

storing packaging parts attributes and foot-print shape changing rules and relationships therebetween in a management table file;

preparing production data used for providing the metal mask plate in a preparation unit operatively connected to the foot-print shape storage unit, the mounting parts data storage unit and the management table file, further comprising:

determining at least two of:
i. an amount of solder to be supplied on the metal mask plate,
ii. a change of the foot-print shape, and
iii. movement of the foot-print shape, preparing production data for the metal mask plate in a data processing unit; and controlling operation of the pattern processing unit and the data processing unit in order to provide the production data; and preparing the metal mask plate in accordance with the production data.

19. A production data preparing method as recited in claim 18, further comprising determining, in the pattern processing unit, an amount of solder to be supplied on the metal mask plate and a change of the foot-print shape.

20. A production data preparing method as recited in claim 18, further comprising determining, in the pattern processing unit, an amount of solder to be supplied on the metal mask plate and movement of the foot-print shape.

21. A production data preparing system as recited in claim 18, further comprising determining, in the pattern processing unit, a change of the foot-print shape and movement of the foot-print shape.

22. A production data preparing system as recited in claim 18, further comprising determining, in the pattern processing unit, each of an amount of solder to be supplied on the metal mask plate, a change of the foot-print shape and movement of the foot-print shape.

* * * * *

UNITED STATES PATENT AND TRADEMARK OFFICE
CERTIFICATE OF CORRECTION

PATENT NO. : 5,751,577
DATED : May 12, 1998
INVENTOR(S) : Akira SAKAI et al.

It is certified that error appears in the above-identified patent and that said Letters Patent is hereby corrected as shown below:

Col. 10, line 8, change "chance" to --change--.

Signed and Sealed this

Twenty-second Day of September, 1998

Attest:

BRUCE LEHMAN

Attesting Officer

Commissioner of Patents and Trademarks